United States Patent
Moeller et al.

(10) Patent No.: US 11,009,576 B2
(45) Date of Patent: May 18, 2021

(54) METHOD FOR MAGNETIC RESONANCE IMAGING USING SLICE QUADRATIC PHASE FOR SPATIOTEMPORAL ENCODING

(71) Applicant: REGENTS OF THE UNIVERSITY OF MINNESOTA, Minneapolis, MN (US)

(72) Inventors: Steen Moeller, St. Louis Park, MN (US); Mehmet Akcakaya, Minneapolis, MN (US)

(73) Assignee: Regents of the University of Minnesota, Minneapolis, MN (US)

(*) Notice: Subject to any disclaimer, the term of this patent is extended or adjusted under 35 U.S.C. 154(b) by 0 days.

(21) Appl. No.: 15/947,001

(22) Filed: Apr. 6, 2018

(65) Prior Publication Data

US 2018/0292488 A1 Oct. 11, 2018

Related U.S. Application Data

(60) Provisional application No. 62/482,286, filed on Apr. 6, 2017.

(51) Int. Cl.
| | | |
|---|---|---|
| *G01V 3/00* | (2006.01) | |
| *G01R 33/483* | (2006.01) | |
| *G01R 33/46* | (2006.01) | |
| *G01R 33/561* | (2006.01) | |

(52) U.S. Cl.
CPC ..... *G01R 33/4836* (2013.01); *G01R 33/4616* (2013.01); *G01R 33/4625* (2013.01); *G01R 33/4633* (2013.01); *G01R 33/4835* (2013.01); *G01R 33/5611* (2013.01); *G01R 33/5616* (2013.01)

(58) Field of Classification Search
CPC .............. G01R 33/543; G01R 33/5659; G01R 33/3415; G01R 33/36; A61B 5/055
USPC ....................................................... 324/309
See application file for complete search history.

(56) References Cited

U.S. PATENT DOCUMENTS

| | | | |
|---|---|---|---|
| 6,650,116 B2 | 11/2003 | Garwood | |
| 10,890,641 B2* | 1/2021 | Wang | G01R 33/56527 |
| 2004/0052730 A1* | 3/2004 | Hochman | C12Q 1/02 424/9.2 |
| 2007/0007959 A1* | 1/2007 | Szyperski | G01R 33/4616 324/307 |
| 2007/0249929 A1* | 10/2007 | Jeong | G01R 33/5615 600/410 |

(Continued)

OTHER PUBLICATIONS

Brau AC, et al. Comparison of reconstruction accuracy and efficiency among autocalibrating data-driven parallel imaging methods. Magn Reson Med 2008;59(2):382-395.

(Continued)

*Primary Examiner* — Walter L Lindsay, Jr.
*Assistant Examiner* — Frederick Wenderoth
(74) *Attorney, Agent, or Firm* — Quarles & Brady LLP

(57) ABSTRACT

Described here are systems and methods for volumetric excitation in magnetic resonance imaging ("MRI") using frequency modulated radio frequency ("RF") pulses. In general, quadratic phase modulation along the slice encoding direction is implemented for additional spatiotemporal encoding, which better distributes signal content in the slice direction and enables higher acceleration rates that are robust to slice-undersampling.

19 Claims, 2 Drawing Sheets

(56) References Cited

U.S. PATENT DOCUMENTS

| | | | | |
|---|---|---|---|---|
| 2008/0204020 A1* | 8/2008 | Chamberlain | ..... | G01R 33/5615 324/312 |
| 2010/0325185 A1* | 12/2010 | Balchandani | ......... | G01R 33/44 708/403 |
| 2011/0148410 A1* | 6/2011 | Zaitsev | .............. | G01R 33/5611 324/309 |
| 2014/0218028 A1* | 8/2014 | Snyder | ............... | G01R 33/4816 324/309 |
| 2015/0309142 A1* | 10/2015 | Li | ...................... | G01R 33/5611 324/309 |
| 2016/0139222 A1* | 5/2016 | Frydman | .............. | G01R 33/483 324/309 |
| 2016/0307301 A1* | 10/2016 | Zhou | .................. | G01R 33/4836 |

OTHER PUBLICATIONS

Breuer FA, et al. Controlled aliasing in volumetric parallel imaging (2D CAIPIRINHA). Magn Reson Med 2006;55(3):549-556.

Frost R, et al. 3D multi-slab diffusion-weighted readout segmented EPI with real-time cardiac-reordered K-space acquisition. Magn Reson Med 2014;72(6):1565-1579.

Griffanti L, et al. ICA-based artefact removal and accelerated fMRI acquisition for improved resting state network imaging. Neuroimage 2014;95:232-247.

Griswold MA, et al. Generalized autocalibrating partially parallel acquisitions (GRAPPA). Magn Reson Med 2002;47(6):1202-1210.

Vanov D, et al. Optimization of simultaneous multislice EPI for concurrent functional perfusion and BOLD signal measurements at 7T. Magn Reson Med 2017;78(1):121-129.

Jeong EK, et al. High-resolution diffusion-weighted 3D MRI, using diffusion weighted driven-equilibrium (DW-DE) and multishot segmented 3DSSFP without navigator echoes. Magn Reson Med 2003;50(4):821-829.

Koopmans PJ. Two-dimensional-NGC-SENSE-GRAPPA for fast, ghosting-robust reconstruction of in-plane and slice-accelerated blipped-CAIPI echo planar imaging. Magn Reson Med 2017;77(3):998-1009.

Moeller S, et al. Noise Amplification Vs. Resolution Tradeoff in the SLIDER Technique. ISMRM 2016:3261.

Moeller SW, et al. SQUASHER: Slice Quadratic Phase with HSn Encoding and Reconstruction. ISMRM 2017:1522.

Moeller, S. et al. fMRI at Ultra High Field (7T) with GRAPPA and SENSE. ISMRM 2006:291.

Posse S, et al. Enhancement of temporal resolution and BOLD sensitivity in real-time fMRI using multi-slab echo-volumar imaging. Neuroimage 2012;61(1):115-130.

Pruessmann KP, et al. SENSE: sensitivity encoding for fast MRI. Magn Reson Med 1999;42(5):952-962.

Robson PM, et al. Comprehensive quantification of signal-to-noise ratio and g-factor for image-based and k-space based parallel imaging reconstructions. Magn Reson Med 2008;60(4):895-907.

Samsonov AA. On optimality of parallel MRI reconstruction in k-space. Magn Reson Med 2008;59(1):156-164.

Setsompop K, et al. High-resolution in vivo diffusion imaging of the human brain with generalized slice dithered enhanced resolution: Simultaneous multislice (gSlider-SMS). Magn Reson Med 2018.

Setsompop K, et al. Improving diffusion MRI using simultaneous multi-slice echo planar imaging. Neuroimage 2012;63(1):569-580.

Setsompop K, et al. SLIce Dithered Enhanced Resolution Simultaneous MultiSlice (SLIDER-SMS) for high resolution (700 um) diffusion imaging of the human brain Proceedings of the 23rd Scientific Meeting of ISMRM; May 2015; Toronto: Proceedings of the 23rd Scientific Meeting of ISMRM.

Setsompop K. et al. Generalized SLIce Dithered Enhanced Resolution Simultaneous MultiSlice (GSlider-SMS) to Increase Volume Encoding, SNR and Partition Profile Fidelity in High-Resolution Diffusion Imaging. ISMRM 2016, p. 0607.

Shrot, Y. et al. Spatially encoded NMR and the acquisition of 2D magnetic resonance images within a single scan J Magn Reson, 172 (2005), pp. 179-190.

Sodickson DK et al. "Simultaneous acquisition of spatial harmonics (SMASH): fast imaging with radiofrequency coil arrays." Magnetic resonance in medicine 38.4 (1997): 591-603.

Weiger M, et al. 2D SENSE for faster 3D MRI. Magma 2002;14(1):10-19.

Wu, W., et al. High-resolution diffusion MRI at 7T using a three-dimensional multi-slab acquisition Neuroimage, vol. 143, Dec. 2016, pp. 1-14.

Sodickson DK, et al. SMASH imaging. Magn Reson Imaging Clin N Am 1999;7(2):237-254, vii-viii.

* cited by examiner

METHOD FOR MAGNETIC RESONANCE IMAGING USING SLICE QUADRATIC PHASE FOR SPATIOTEMPORAL ENCODING

CROSS-REFERENCE TO RELATED APPLICATIONS

This application claims the benefit of U.S. Provisional Patent Application Ser. No. 62/482,286, filed on Apr. 6, 2017, and entitled "METHOD FOR MAGNETIC RESONANCE IMAGING USING SLICE QUADRATIC PHASE FOR SPATIOTEMPORAL ENCODING," which is herein incorporated by reference in its entirety.

STATEMENT REGARDING FEDERALLY SPONSORED RESEARCH

This invention was made with government support under EB015894 awarded by the National Institutes of Health. The government has certain rights in the invention.

BACKGROUND

When acquiring magnetic resonance signals encoded for use with a Fourier reconstruction, the k-space corresponding to high frequency encoded information has lower signal-to-noise ratio ("SNR") than low frequency information. Applications of magnetic resonance imaging ("MRI") of the brain have been pushing for higher spatial resolution imaging, which requires trade-offs between scan time, SNR, and resolution.

Magnetic resonance imaging ("MRI") includes perturbing the magnetic equilibrium of nuclear spins in an object using a radio frequency ("RF"), spatially encoding nuclear spins in the object, and acquiring measurements of magnetic resonance signals originating from the nuclear spins, which represent data in k-space. Single-shot imaging includes acquiring k-space data following a single application of an RF excitation, and is commonly performed using a spiral or echo-planar imaging ("EPI") sampling of k-space. Line-scanning is when, following RF excitation, a single line in k-space is acquired. To obtain a complete sampling of k-space, the RF excitation is repeated and the complete k-space is obtained in segments. Each segment can contain anywhere from a single sample to obtaining all of k-space The SNR or acquired measurements in two-dimensional imaging at higher and higher spatial resolutions (e.g., sub-millimeter and higher) can often be too low for routine clinical use. Three-dimensional slab acquisitions offer higher SNR of the measured signals, require longer acquisition times to resolve the image, and are challenged by the natural temporal variability in the object. Serial acquisitions of 3D k-space can be applied by choosing a fast and slow direction along which the 3D k-space is sampled. The slowest direction is commonly the direction with the lowest spatial resolution, which is normally the slice-encoding direction.

Segmentation of 3D k-space can be performed using either fast or slow scanning techniques. The applicability of these segmentations is hindered, however, due to physiological and systematic limitations, such as motion-induced data inconsistencies from field variations or object movement, which can be especially pronounced in segmented diffusion-weighted EPI, and are larger for data acquisitions along the slow (e.g., phase encoding) direction and slowest slice-encoding direction. Measurements that are obtained further from the center of k-space reflect higher spatial resolution information, and in standard 3D encoding there is not a natural consistency between data acquired along the slow or slowest direction, which makes it difficult to correct for such variations without additional information. Changes in RF pulse shapes have been proposed to tackle this challenge for the slice-encoding direction.

SUMMARY OF THE DISCLOSURE

The present disclosure addresses the aforementioned drawbacks by providing a method for imaging a subject with a magnetic resonance imaging ("MRI") system. A radio frequency ("RF") excitation waveform is provided to the MRI system. The RF excitation waveform defines a frequency-swept RF excitation with a quadratic phase profile (e.g., a quadratic phase profile along a slice-encoding direction). Data are acquired from a subject using the MRI system and a pulse sequence that includes the provided RF excitation waveform. An image of the subject is reconstructed from the acquired data.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Figure 1:
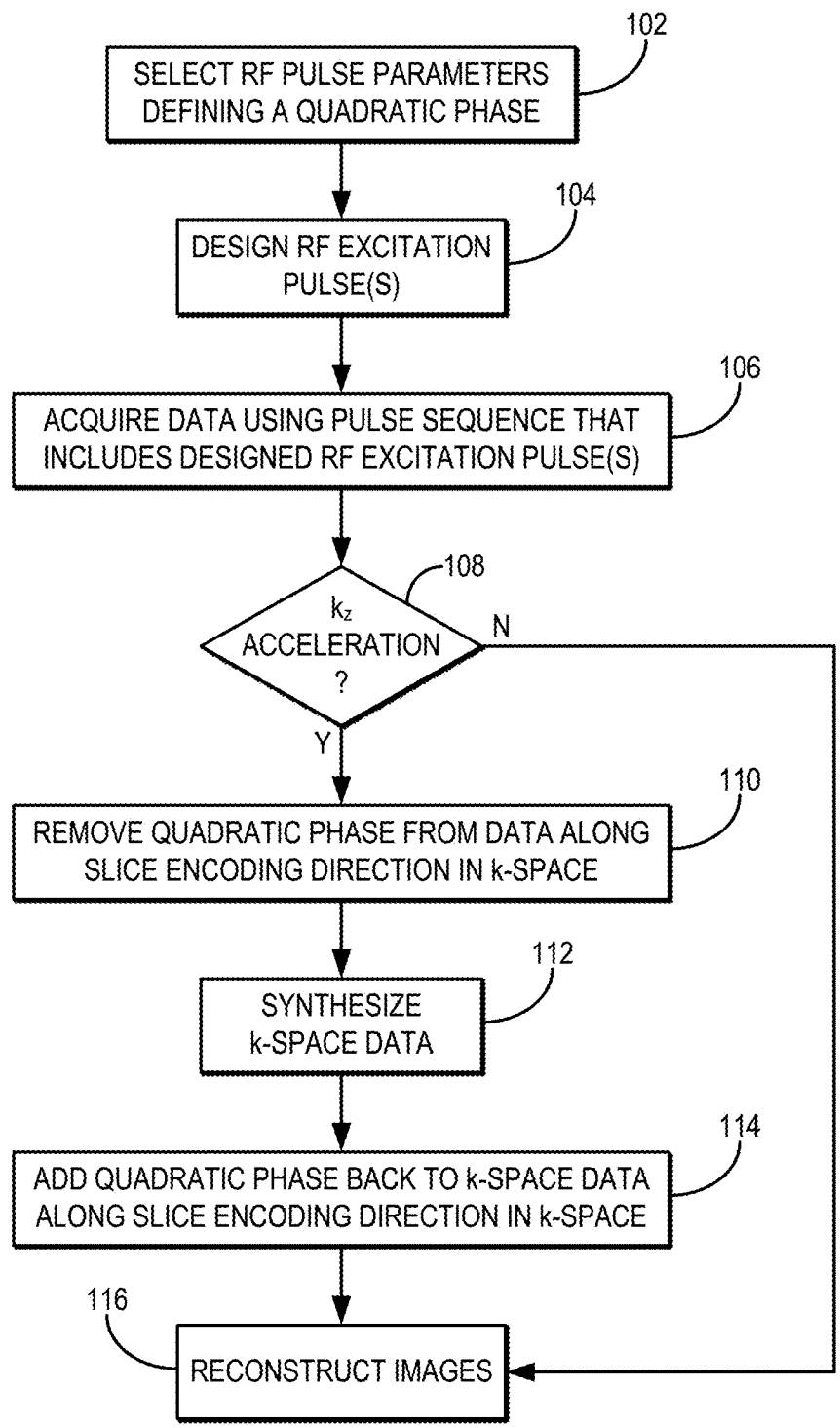
FIG. 1 is a flowchart setting forth the steps of an example method for imaging a subject using a frequency modulated radio frequency ("RF") excitation with slice quadratic phase, and an associated image reconstruction.

Described here are systems and methods for volumetric excitation in magnetic resonance imaging ("MRI") using frequency modulated radio frequency ("RF") pulses. In general, quadratic phase modulation along with three-dimensional Fourier encoding are implemented to better distribute signal content in the slice direction, and to enable higher acceleration rates that are robust to slice-undersampling and combined phase-encoding and slice-encoding undersampling. A modified reconstruction algorithm is also described. As one example, the systems and methods described in the present disclosure can be referred to as slice quadratic phase with hyperbolic secant ("HSn") encoding and reconstruction, or "SQUASHER." Motion corrections can be performed before resolving the signal along the slab direction.

The R-value describing the shape of the quadratic phase in the frequency swept RF pulse is selected to match the resolution that is desired in the slab direction of the 3D volume. By selecting these parameters to be matched, the signal is spread out along the slice-encoding direction in the acquisition domain, which has the property of exhibiting a spatially localized emphasis along the slice-encoding direction prior to image reconstruction. For a series of RF pulses, the net R-value from all pulses describing the shape of the quadratic phase in the frequency swept RF pulse is selected to match the resolution that is desired in the slab direction of the 3D volume.

This spatially localized emphasis along the slice-encoding direction has several advantages. As one example, this allows for correcting for variations in the phase between different slice segments in echo-planar imaging ("EPI") pulse sequences by enabling the ability to impose a slowly varying phase-constraint across the slice-encoding direction prior to performing a Fourier transform. This approach allows the acquired signals to be fully resolved along the slab direction.

As another example, the spatially localized emphasis along the slice-encoding direction provides the ability to identify from the magnitude when a slice segment is reflecting that there has been motion or movement in the object being imaged. When motion is identified, either from external measures or from internal data-consistency, the change in effective slice direction can be calculated and used to reassign the correct encoding for such a subset of the measured data, or can be implemented in an image reconstruction that incorporates a motion model to correct the entire acquisition to be consistent.

As another example, the ability to perform the spatial localization as noted above allows for undersampling the encoding along the slab dimension using the imposed quadratic phase, even when the slab is narrow. This approach allows for a faster acquisition of conventional high-resolution clinical images.

As another example, the ability to perform the spatial localization as noted above allows for undersampling the encoding along both the slice-encoding (or slab-encoding) direction using the imposed quadratic phase, and along the phase-encoding direction. The undersampling along the phase-encoding direction can be different for each slice-encoding direction, such as by using a sheared sampling pattern or a random sampling pattern, the latter of which can be beneficial for compressed sensing-based reconstructions. In some embodiments, an additional quadratic phase can also be imposed along the phase-encoding direction.

Thus, in some implementations, the methods described in the present disclosure use the advantages of Fourier encoding and the phase correction abilities of a generalized inversion approach by imposing a quadratic phase in the slice direction across the slab. As one example, this quadratic phase can be imposed using a frequency-swept HSn RF pulse for excitation instead of a sinc pulse. As another example, the RF pulse can be a frequency-swept RF pulse with an amplitude modulation different from an HSn modulation. In still other examples, the RF pulse can be a frequency-swept RF pulse with a constant amplitude. This technique has similar noise amplification to Fourier encoding, as the quadratic phase modulated magnetization can be recovered with a simple Fourier transform. Furthermore, similar contrast and SNR can be achieved with the methods described in the present disclosure as compared to conventional Fourier encoding with a sinc excitation pulse.

As mentioned above, the quadratic phase modulation spreads the k-space spectrum in the slice direction, as opposed to typical Fourier encoding that has a concentrated spectrum around the central $k_z$ slices. Following a 2D Fourier transform in-plane, this leads to higher SNR images for the outer $k_z$ slices in this hybrid-transform space, compared to Fourier encoding. This difference in k-space spectrum provides several advantages during image reconstruction.

As one advantage, by first removing the slice-specific phase contribution from the global quadratic phase from each of the slices, phase correction can be performed across multiple encoded slices to enforce phase continuity and smoothness across the volume, in order to generate consistent and high-resolution slice information. Another advantage of the more uniform k-space spectrum spread across $k_z$ slices is in enabling higher acceleration rates in the $k_z$ phase encode direction.

Preliminary data showed that using a similar type of phase correction along with a GRAPPA-type interpolation approach, for FLASH imaging, yielded a 2×2 acceleration without apparent loss of quality; whereas the same 2×2 accelerated volume acquired using Fourier encoding with sinc excitation exhibited significant noise amplification. Thus, the SQUASHER approached described in the present disclosure can facilitate an additional acceleration in acquisition times by enabling 2-fold slice undersampling, even in small slabs.

Advantageously, the SQUASHER approaches described in the present disclosure can be used for imaging techniques such as functional MRI ("fMRI") and diffusion MRI ("dMRI") to achieve sub-millimeter isotropic resolution. For instance, each $k_z$ slice can be acquired as one segment in a segmented acquisition, using 2-fold to 3-fold in-plane uniform undersampling and partial Fourier imaging (6/8) for a high in-plane resolution. Hence, the coverage of a thin 3D slab will use a number of slices encodings to cover. Additional benefits can be achieved by exploiting the slice acceleration properties of the methods described in the present disclosure.

As an example, the SQUASHER approach described in the present disclosure can be implemented in echo planar imaging ("EPI") acquisitions. In addition. $k_z$-dependent reconstruction can be implemented to provide for highly-accelerated 3D segmented EPI in dMRI. For instance, a 3D-EPI acquisition with slice and phase-encoding segmentation using frequency swept pulses for excitation and refocusing can be implemented. As one example, such an acquisition could be implemented to image thin slabs of less than 10 slices.

The SQUASHER techniques described in the present disclosure also naturally lend themselves to multiband imaging; thus, whole brain coverage can be achieved using simultaneous multislice, or multislab, imaging with SQUASHER.

The reconstruction pipeline can implement the removal of the quadratic phase, followed by phase correction due to segmentation, and k-space reconstruction for multiband and parallel imaging, followed by quadratic phase correction and inverse Fourier transform to generate the 3D slabs.

In one example study, slabs with 5-7 mm thickness and with 0.6-0.8 mm isotropic resolution were acquired using the SQUASHER techniques described in the present disclosure.

In another example study, phantom and human experiments were conducted on a 7 T MRI scanner using a single-channel transmit, 32-channel receive head coil. A 3D FLASH pulse sequence was modified such that stretched hyperbolic secant pulses (e.g., HS8 pulses) were used for RF excitation. When using HS8 pulses for excitation, the phase-encode gradients applied in the slice direction may also shift the vertex of the quadratic, through-plane phase distribution of the resulting transverse magnetization.

To demonstrate the high resolution imaging capabilities of the methods described in the present disclosure, 3D FLASH images were acquired using HS8 pulses. Relevant imaging parameters were FOV=256×256×24 mm³, spatial resolution was 0.4×0.4×0.8 mm³, echo time ("TE") was 21 ms, repetition time ("TR") was 39 ms, and nominal flip angles were 18 degrees. A slab oversampling of 20 percent, and in-plane undersampling with an acceleration factor of 2 was used. Auto-calibration signal ("ACS") data were acquired with the same imaging parameters, with lower phase-encoding resolution for a spatial resolution of 0.4×4.8×0.8 mm³.

To localize the signal along the slice direction and match the FOV resolution, the time-bandwidth product (or R-value) of the HS8 pulse characterizing the shape of the quadratic phase was set to the number of slices being resolved in the slice direction. In this example study, HS8 with R=60 (HS8R60) was used for the phantom experiments, whereas HS8R30 was used for the in-vivo experiments. For all acquisitions, gradient spoiling was applied to minimize image artifacts due to stimulated echoes.

For acceleration along the $k_z$ dimension, a modified GRAPPA algorithm was developed. The algorithm removes the quadratic phase along the $k_z$ direction (i.e., temporal spreading) of the signal prior to signal interpolation with GRAPPA and then adds back the quadratic phase after signal interpolation. The mathematical description of this algorithm is given as, $$ksp_{recon} = \Phi_t(RF) \cdot GRAPPA_{t' \to t}(\overline{\Phi_t(RF)}) \cdot ksp_{meas}(\vec{r}, z'))z' \subset z \quad (1);$$

where $ksp_{meas}$ and $ksp_{recon}$ represents the measured and reconstructed k-space data, respectively; t represents the in-plane spatial coordinates; $_z$ represents the through-plane k-space coordinate; $\Phi$ represents the quadratic phase of the signal; and GRAPPA is the GRAPPA reconstruction (e.g., the GRAPPA reconstruction kernel).

The SENSE equivalent formulation is to consider, $$(\Phi_Q \otimes_{slice} s) = E(\Phi_Q \otimes_{slice} d) \quad (2);$$

where s is the acquired aliased image from each channel, E is the full spatial sensitivity encoding matrix, d is the unaliased image, $\otimes_{slice}$ is a convolution along the slice direction, and $\Phi_Q$ is the Fourier transform of the quadratic RF phase.

Referring now to FIG. 1, a flowchart is illustrated as setting forth the steps of an example method for acquiring data from a subject using a SQUASHER MRI technique, and for reconstructing images from such data.

The method includes selecting one or more RF excitation pulse parameters that define a quadratic phase, as indicated at step 102. As described above, such parameters can include the time-bandwidth product, or R-value, for a frequency swept RF pulse, such as a hyperbolic secant ("HSn") RF pulse. In general, these parameters are selected to match the spatial resolution in the field-of-view. For instance, the parameters can be matched with the spatial resolution in the slab encoding direction of a three-dimensional image volume. As one non-limiting example, the R-value can be set to the number of phase encoding steps. Based on these parameters, one or more RF excitation pulses are then designed, as indicated at step 104. For example, the parameters can be used to generate the RF excitation waveforms.

Data are then acquired from the subject with the MRI system using a pulse sequence that include the one or more RF excitation pulses, as indicated at step 106. As described above, in some embodiments the pulse sequence can implement in-plane acceleration, such as be skipping phase encoding lines. In some other embodiments, the pulse sequence can implement acceleration in the through-plane direction, such as by skipping $k_z$ lines. In some other example, the quadratic phase can be introduced by a frequency-swept refocusing pulse in a spin-echo experiment. As one example, multiband RF excitation pulses can be used for simultaneous multislice, or multislab, acquisitions. In these instances, the RF excitation pulses are designed in step 104 as multiband RF pulses. The multiband RF pulses can be independently controlled to enable slab-specific field-of-view shifting, and the gradient encoding can also be used to control a relative field-of-view shift of the slabs.

When acceleration along the slice encoding direction is implemented by skipping $k_z$ lines, additional processing of the acquired data can be used, as determined at decision block 108. For instance, when in-plane acceleration is implemented, the quadratic phase is first removed from the k-space data along the slice-encoding direction (e.g., the $k_z$ direction), as indicated at step 110. Additional k-space data re then synthesized, as indicated at step 112. As an example, a GRAPPA technique can be used to synthesize this additional k-space data at missing phase encoding lines, and it can use measured data from different $k_z$ lines to better synthesize skipped measurements. After the additional k-space data are synthesized, the quadratic phase is added back to the total k-space data, as indicated at step 114. Images are then reconstructed from the k-space data, as indicated at step 116.

Thus, described here is the use of frequency-swept RF pulses with R-values matched with a desired number of resolved slices (e.g., high R-values) to broaden the refocused encoded signal, leading to a more even signal distribution in the hybrid (x,y,$k_z$) space. The acquired signal in {x,$k_z$} is modulated with the quadratic phase from the excitation. By leveraging this knowledge, a modified GRAPPA algorithm was described and implemented for slice-undersampling in the slab with limited spatial coverage, with little degradation in reconstruction quality at 2-fold acceleration.

Because the signal properties in this hybrid (x,y,$k_z$) space have direct spatial information, the signal encoding provided by the methods described in the present disclosure is different from conventional imaging. As such, the signal encoding provided by the methods described in the present disclosure can be used for self-calibration of the data, correction of certain systematic imperfections, and correction of physiological imperfections for segmented acquisitions. The technique can find use for very high resolution acquisitions, enabling faster scanning and thus reduced occurrence of motion artifacts.

Figure 2:
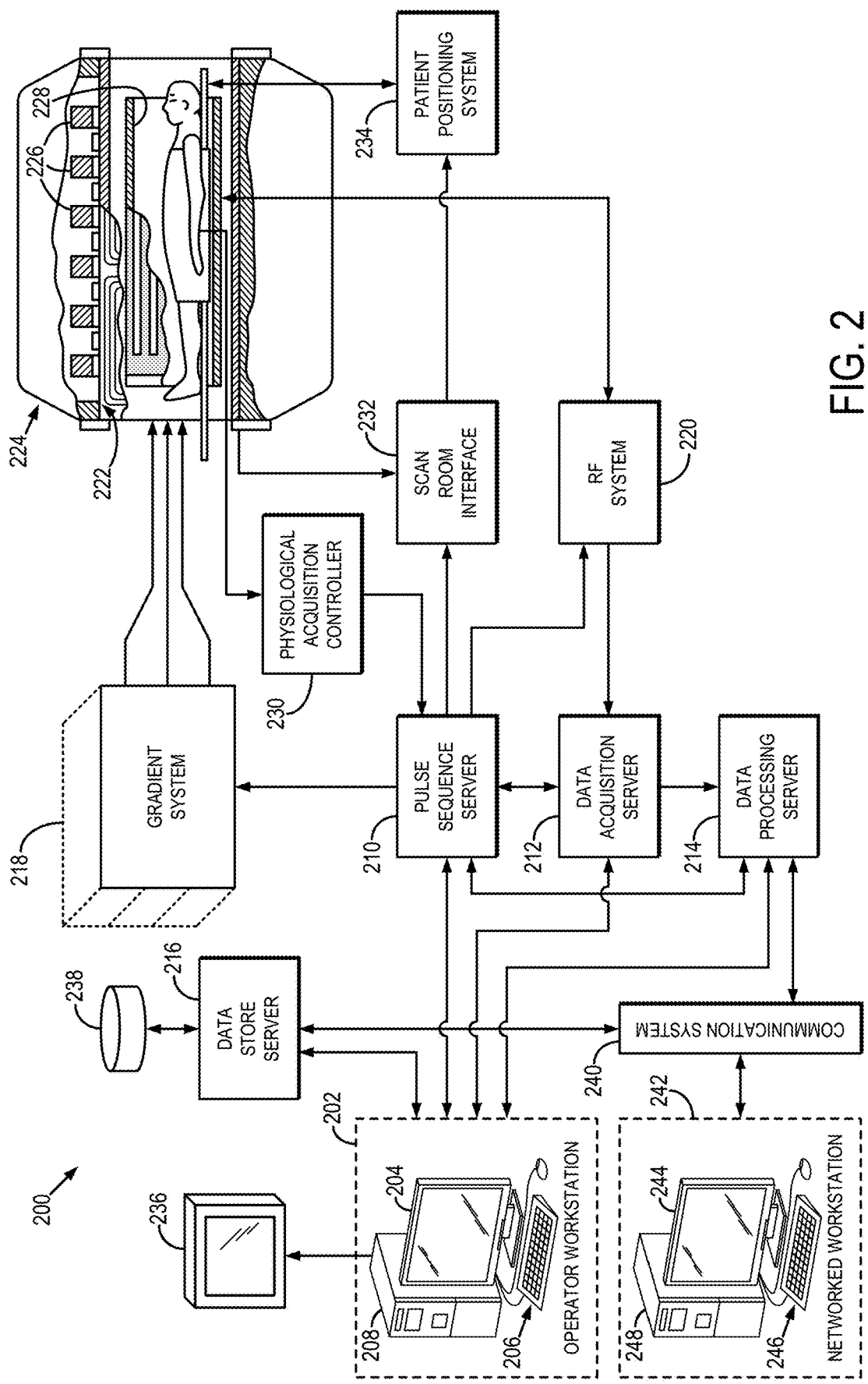
FIG. 2 is a block diagram of an example magnetic resonance imaging ("MRI") system that can implement the methods described in the present disclosure.

Referring particularly now to FIG. 2, an example of an MRI system 200 that can implement the methods described here is illustrated. The MRI system 200 includes an operator workstation 202 that may include a display 204, one or more input devices 206 (e.g., a keyboard, a mouse), and a processor 208. The processor 208 may include a commercially available programmable machine running a commercially available operating system. The operator workstation 202 provides an operator interface that facilitates entering scan parameters into the MRI system 200. The operator workstation 202 may be coupled to different servers, including, for example, a pulse sequence server 210, a data acquisition server 212, a data processing server 214, and a data store server 216. The operator workstation 202 and the servers 210, 212, 214, and 216 may be connected via a communication system 240, which may include wired or wireless network connections.

The pulse sequence server 210 functions in response to instructions provided by the operator workstation 202 to operate a gradient system 218 and a radiofrequency ("RF")

system 220. Gradient waveforms for performing a prescribed scan are produced and applied to the gradient system 218, which then excites gradient coils in an assembly 222 to produce the magnetic field gradients $G_x$, $G_y$, and $G_z$ that are used for spatially encoding magnetic resonance signals. The gradient coil assembly 222 forms part of a magnet assembly 224 that includes a polarizing magnet 226 and a whole-body RF coil 228.

RF waveforms are applied by the RF system 220 to the RF coil 228, or a separate local coil to perform the prescribed magnetic resonance pulse sequence. Responsive magnetic resonance signals detected by the RF coil 228, or a separate local coil, are received by the RF system 220. The responsive magnetic resonance signals may be amplified, demodulated, filtered, and digitized under direction of commands produced by the pulse sequence server 210. The RF system 220 includes an RF transmitter for producing a wide variety of RF pulses used in MRI pulse sequences. The RF transmitter is responsive to the prescribed scan and direction from the pulse sequence server 210 to produce RF pulses of the desired frequency, phase, and pulse amplitude waveform. The generated RF pulses may be applied to the whole-body RF coil 228 or to one or more local coils or coil arrays.

The RF system 220 also includes one or more RF receiver channels. An RF receiver channel includes an RF preamplifier that amplifies the magnetic resonance signal received by the coil 228 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \quad (3);$$

and the phase of the received magnetic resonance signal may also be determined according to the following relationship:

$$\varphi = \tan^{-1}\left(\frac{Q}{I}\right). \quad (4)$$

The pulse sequence server 210 may receive patient data from a physiological acquisition controller 230. By way of example, the physiological acquisition controller 230 may receive signals from a number of different sensors connected to the patient, including electrocardiograph ("ECG") signals from electrodes, or respiratory signals from a respiratory bellows or other respiratory monitoring devices. These signals may be used by the pulse sequence server 210 to synchronize, or "gate," the performance of the scan with the subject's heart beat or respiration.

The pulse sequence server 210 may also connect to a scan room interface circuit 232 that receives signals from various sensors associated with the condition of the patient and the magnet system. Through the scan room interface circuit 232, a patient positioning system 234 can receive commands to move the patient to desired positions during the scan.

The digitized magnetic resonance signal samples produced by the RF system 220 are received by the data acquisition server 212. The data acquisition server 212 operates in response to instructions downloaded from the operator workstation 202 to receive the real-time magnetic resonance data and provide buffer storage, so that data is not lost by data overrun. In some scans, the data acquisition server 212 passes the acquired magnetic resonance data to the data processor server 214. In scans that require information derived from acquired magnetic resonance data to control the further performance of the scan, the data acquisition server 212 may be programmed to produce such information and convey it to the pulse sequence server 210. For example, during pre-scans, magnetic resonance data may be acquired and used to calibrate the pulse sequence performed by the pulse sequence server 210. As another example, navigator signals may be acquired and used to adjust the operating parameters of the RF system 220 or the gradient system 218, or to control the view order in which k-space is sampled. In still another example, the data acquisition server 212 may also process magnetic resonance signals used to detect the arrival of a contrast agent in a magnetic resonance angiography ("MRA") scan. For example, the data acquisition server 212 may acquire magnetic resonance data and processes it in real-time to produce information that is used to control the scan.

The data processing server 214 receives magnetic resonance data from the data acquisition server 212 and processes the magnetic resonance data in accordance with instructions provided by the operator workstation 202. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 214 are conveyed back to the operator workstation 202 for storage. Real-time images may be stored in a data base memory cache, from which they may be output to operator display 202 or a display 236. Batch mode images or selected real time images may be stored in a host database on disc storage 238. When such images have been reconstructed and transferred to storage, the data processing server 214 may notify the data store server 216 on the operator workstation 202. The operator workstation 202 may be used by an operator to archive the images, produce films, or send the images via a network to other facilities.

The MRI system 200 may also include one or more networked workstations 242. For example, a networked workstation 242 may include a display 244, one or more input devices 246 (e.g., a keyboard, a mouse), and a processor 248. The networked workstation 242 may be located within the same facility as the operator workstation 202, or in a different facility, such as a different healthcare institution or clinic.

The networked workstation 242 may gain remote access to the data processing server 214 or data store server 216 via the communication system 240. Accordingly, multiple networked workstations 242 may have access to the data processing server 214 and the data store server 216. In this manner, magnetic resonance data, reconstructed images, or other data may be exchanged between the data processing server 214 or the data store server 216 and the networked workstations 242, such that the data or images may be remotely processed by a networked workstation 242.

The present disclosure has described one or more preferred embodiments, and it should be appreciated that many equivalents, alternatives, variations, and modifications, aside from those expressly stated, are possible and within the scope of the invention.

The invention claimed is:

1. A method for imaging a subject with a magnetic resonance imaging (MRI) system, the steps of the method comprising:
    (a) providing a radio frequency (RF) excitation waveform to the MRI system, wherein the RF excitation waveform defines a frequency-swept RF excitation with a quadratic phase profile;
    (b) acquiring data from a subject using the MRI system and a pulse sequence that includes the provided RF excitation waveform; and
    (c) reconstructing an image of the subject from the acquired data, wherein reconstructing the image comprises using a reconstruction algorithm in which the quadratic phase profile of the RF excitation waveform is used as a parameter during reconstruction of the image to remove slice-specific phase contributions along a slice encoding direction of the acquired data before performing at least one of phase correction or signal interpolation on the acquired data, and wherein the quadratic phase profile of the RF excitation waveform provides additional spatial encoding information.

2. The method as recited in claim 1, wherein the RF excitation waveform is selected to have a time-bandwidth product that is matched based at least in part on a spatial resolution achieved by the pulse sequence along a slice encoding direction.

3. The method as recited in claim 2, wherein the time-bandwidth product is selected as a number of slices being resolved along the slice encoding direction.

4. The method as recited in claim 1, wherein the RF excitation waveform is a frequency-swept hyperbolic secant (Hsn) RF excitation waveform.

5. The method as recited in claim 1, wherein step (c) includes:
    removing the quadratic phase from the acquired data along the slice encoding direction;
    synthesizing additional k-space lines along the slice encoding direction;
    forming combined k-space data by combining the additional k-space lines with the acquired data;
    adding the quadratic phase to the combined k-space data along the slice-encoding directions to form updated data; and
    reconstructing the image of the subject from the updated data.

6. The method as recited in claim 5, wherein the additional k-space lines are synthesized using a GRAPPA algorithm.

7. The method as recited in claim 5, wherein the synthesized additional k-space lines are different for adjacent slice encoding planes.

8. The method as recited in claim 1, wherein step (c) includes reconstructing the image using a SENSE algorithm that includes a convolution along the slice encoding direction using a Fourier transform of the quadratic phase.

9. The method as recited in claim 1, wherein the RF excitation waveform comprises a multiband RF excitation that simultaneously excites spins in multiple different slices.

10. The method as recited in claim 9, wherein the multiband RF excitation comprises a field-of-view shift applied along the phase-encoding direction in an alternating manner.

11. The method as recited in claim 1, wherein the data are acquired in step (b) from a three-dimensional image volume using a three-dimensional slab acquisition.

12. The method as recited in claim 1, wherein the pulse sequence used in step (b) is an echo planar imaging (EPI) pulse sequence, and step (c) includes spatially aligning data in the acquired data before reconstructing the image of the subject.

13. The method as recited in claim 1, wherein the quadratic phase profile of the RF excitation waveform is a quadratic phase along a slice encoding direction.

14. The method as recited in claim 13, wherein the quadratic phase profile of the RF excitation waveform also includes a quadratic phase along a phase encoding direction.

15. The method as recited in claim 1, the pulse sequence also includes a frequency-swept RF refocusing pulse with the quadratic phase profile.

16. The method as recited in claim 1, wherein the data acquired in step (b) are acquired by sampling k-space in a random pattern.

17. The method as recited in claim 1, further comprising,
    identifying motion corrupted data that has been corrupted by motion that occurred when the data were acquired in step (b);
    generating corrected data by correcting the motion corrupted data based on a magnitude of the acquired data; and
    reconstructing the image in step (c) from the corrected data.

18. The method as recited in claim 17, wherein generating the corrected data comprises calculating a change in effective slice direction from the magnitude of the acquired data and reassigning a correct encoding for the motion corrupted data.

19. The method as recited in claim 1, further comprising,
    identifying motion corrupted data that has been corrupted by motion that occurred when the data were acquired in step (b);
    calculating a change in effective slice direction from the magnitude of the acquired data; and
    reconstructing the image in step (c) from the acquired data using an image reconstruction algorithm implemented with a hardware processor and a memory, wherein the image reconstruction algorithm incorporates a motion model that uses the calculated change in effective slice direction to correct the acquired data to be consistent.

* * * * *